US009671655B2

United States Patent
Zhao

(10) Patent No.: US 9,671,655 B2
(45) Date of Patent: Jun. 6, 2017

(54) ARRAY SUBSTRATE, MANUFACTURE METHOD THEREOF, AND LIQUID CRYSTAL DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Haiting Zhao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 216 days.

(21) Appl. No.: 14/379,818

(22) PCT Filed: Jul. 25, 2013

(86) PCT No.: PCT/CN2013/080063
§ 371 (c)(1),
(2) Date: Aug. 20, 2014

(87) PCT Pub. No.: WO2014/169543
PCT Pub. Date: Oct. 23, 2014

(65) Prior Publication Data
US 2016/0187732 A1 Jun. 30, 2016

(30) Foreign Application Priority Data
Apr. 18, 2013 (CN) .......................... 2013 1 0136326

(51) Int. Cl.
H01L 21/66 (2006.01)
H01L 27/12 (2006.01)
(Continued)

(52) U.S. Cl.
CPC ...... *G02F 1/134309* (2013.01); *G02F 1/1362* (2013.01); *G02F 1/1368* (2013.01);
(Continued)

(58) Field of Classification Search
CPC ........... G02F 1/134309; G02F 1/13439; G02F 1/136227; G02F 1/1368; G02F 1/1362;
(Continued)

(56) References Cited

U.S. PATENT DOCUMENTS

2002/0135722 A1 9/2002 Lee
2008/0266480 A1 10/2008 Lee
(Continued)

FOREIGN PATENT DOCUMENTS

CN 1377020 A 10/2002
CN 101144952 A 3/2008
(Continued)

OTHER PUBLICATIONS

International Preliminary Report on Patentability Appln. No. PCT/CN2013/080063; Dated Oct. 20, 2015.
(Continued)

*Primary Examiner* — Caleen Sullivan
(74) *Attorney, Agent, or Firm* — Ladas & Parry LLP

(57) ABSTRACT

An array substrate, a manufacture method thereof, and a liquid crystal display device (LCD) are provided. The array substrate includes a substrate; and a plurality of sub-pixel units disposed on the substrate. The sub-pixel unit comprises a thin film transistor (TFT), a pixel electrode, a common electrode and a passivation layer. The thin film transistor comprises an active layer, a gate electrode, a source electrode and a drain electrode. The drain electrode is electrically connected with the pixel electrode. The passivation layer covers the source electrode, the drain electrode and the pixel electrode. The sub-pixel unit further includes a test
(Continued)

electrode which is electrically connected with the pixel electrode and is exposed at an external surface of the sub-pixel unit. With the test electrode, electrical characteristics of the TFT can be tested conveniently, and the quality level of the LCD device can also be improved.

20 Claims, 5 Drawing Sheets

(51) Int. Cl.
  *G02F 1/1343* (2006.01)
  *G02F 1/1368* (2006.01)
  *G02F 1/1362* (2006.01)
(52) U.S. Cl.
  CPC .... *G02F 1/13439* (2013.01); *G02F 1/136227* (2013.01); *H01L 22/30* (2013.01); *H01L 22/32* (2013.01); *H01L 27/127* (2013.01); *H01L 27/1222* (2013.01); *G02F 2001/134345* (2013.01); *G02F 2001/134372* (2013.01); *G02F 2001/136254* (2013.01)
(58) Field of Classification Search
  CPC ........ G02F 2001/134345; G02F 2001/134372; G02F 2001/136254; G02F 1/133345; G02F 2001/134318; G02F 1/133516; H01L 22/30; H01L 27/127; H01L 27/1222; H01L 27/1214; H01L 27/12; H01L 27/1259; H01L 29/4908; H01L 29/786; H01L 21/0274; H01L 27/3258; H01L 21/31144; H01L 21/76802; H01L 21/76877; H01L 27/14603; H01L 27/3262; H01L 27/3272; H01L 29/42384; H01L 21/32139; H01L 21/77; H01L 27/1251; H01L 51/56; G09G 3/006
  USPC .......................................................... 257/48
  See application file for complete search history.

(56) References Cited

U.S. PATENT DOCUMENTS

2012/0127415 A1   5/2012   Ishikawa et al.
2014/0138685 A1   5/2014   Zhang

FOREIGN PATENT DOCUMENTS

CN   102540600 A   7/2012
CN   102944959 A   2/2013
CN   103217840 A   7/2013

OTHER PUBLICATIONS

International Search Report Appln. No. PCT/CN2013/080063; Dated Jan. 16, 2014.
First Chinese Office Action Appln. No. 201310136326.2; Dated Jan. 16, 2015.

ARRAY SUBSTRATE, MANUFACTURE METHOD THEREOF, AND LIQUID CRYSTAL DISPLAY DEVICE

TECHNICAL FILED

Embodiments of the present invention relate to an array substrate, a manufacture method thereof, and a liquid crystal display device.

BACKGROUND

With the development of science and technology, CRT display devices that are quite heavy have been substituted by flat panel display devices which are increasingly merging into people's daily lives. The liquid crystal display (LCD) device is a kind of flat panel display device having a liquid crystal (LC) panel as its major component. The LC panel substantially comprises a color filter (CF) substrate and an array substrate, and liquid crystals filling there-between. An electrode for generating an electric field is also disposed in either the array substrate or the CF substrate. The structure and configuration of the electrode can determine the deflection of the liquid crystals, thus influence the display of the LC panel. The LC panel is provided with a plurality of pixel points (each generally includes three sub-pixels, i.e., R, G, and B) each controlled by a thin film transistor (TFT) manufactured in the array substrate during the imaging, so as to achieve active driving and image displaying. The TFT, as a controlling switch, is the key point for achieving the display function of a LCD display, and has the direct bearing on the development direction of high-performance flat panel display devices.

The ADvanced Super Dimension Switch (ADS, also referred to ADSDS) technology emerges as required by the development of LCD technique and the demands for high brightness, high contrast ratio and low energy consumption. The ADS-based array substrate usually comprises two layers of electrodes located at a same side of the LC cell, one of which is a slot electrode layer and the other is a plate electrode layer. By forming a multi-dimensional electric field consisted of an electric field generated between edge of slit electrode and the plate electrode layer and an electric field generated between slit electrodes, all the LC molecules located in the LC cell are deflected, so that the working efficiency of the liquid crystals is improved and the viewing angle is broadened. The ADS technique can increase the aperture ratio of pixels, thereby raising the brightness, reducing the energy consumption, as well as improving the quality level of a LCD panel and the image quality of TFT-LCD products.

Generally, for a ADS-based array substrate, a plate-like common electrode is located in a lower layer while a slit-like pixel electrode is located in an upper layer in a sub-pixel unit. For a high aperture ADS (H-ADS)-based array substrate, a plate-like pixel electrode, which is connected with a drain electrode of TFT, is located in a lower layer while a slit-like common electrode is located in an upper layer, in a sub-pixel unit. For a H-ADS-based array substrate, since a pixel electrode is covered by a passivation layer (PVX) and a common electrode which are located on the pixel electrode, a test probe cannot access the pixel electrode or the drain electrode when an electrical characteristic test is conducted on a TFT (such as a test on switching current, threshold voltage and electron mobility of the TFT) in the sub-pixel unit, after the array substrate is made; as a result, it is impossible to test the characteristics of the TFT, which further leads to inconvenience in monitoring the electrical characteristics of the TFT. Therefore, it requires a prompt solution in the industry to improve the convenience for measuring a pixel electrode in an array substrate and to improve the product quality of the array substrate.

SUMMARY

To overcome the defects above, embodiments of the present invention provide an array substrate, a manufacture method thereof, and a LCD device, which can conveniently conduct an electrical characteristic test on a TFT by directly leading a signal of a pixel electrode or a drain electrode located in an internal layer to an uppermost layer of a sub-pixel unit by using a test electrode, which solves a problem that the electrical characteristics of a TFT under conventional design are difficult to measure.

According to an aspect of the present invention, an array substrate is provided. The array substrate comprises a substrate and a plurality of sub-pixel units provided on the substrate. The sub-pixel unit comprises a thin film transistor, a pixel electrode, a common electrode and a passivation layer. The thin film transistor comprises an active layer, source electrode and drain electrode located on the active layer at two sides respectively. The drain electrode extends onto a gate insulating layer and is partially overlapped with the pixel electrode, or, the drain electrode extends onto the pixel electrode and is partially overlapped with the pixel electrode.

According to an embodiment of the present invention, the common electrode and a test electrode are made from a same material which includes at least one of Indium Gallium Zinc Oxide (IGZO), Indium Zinc Oxide (IZO), Indium Tin Oxide (ITO) and Indium Gallium Tin Oxide (IGTO).

According to a further embodiment of the present invention, each the sub-pixel unit in the array substrate comprises the test electrode; or, one sub-pixel unit from every N adjacent sub-pixel units comprises the test electrode, where N is a positive integer equal to or larger than 2.

According to another aspect of the present invention, a LCD device is provided, which comprises the described array substrate.

According to another aspect of the present invention, a method of manufacturing an array substrate is provided, which comprises a step of forming a thin film transistor, a pixel electrode, a common electrode and a passivation layer on a substrate; wherein the thin film transistor comprises an active layer, a gate electrode, a source electrode and a drain electrode, and the passivation layer is formed on the source electrode, the drain electrode and the pixel electrode; a step of forming a via hole in the passivation layer located on the drain electrode; and a step of forming a test electrode which passes through the via hole from an upper surface of the drain electrode and projects out of an external surface of the passivation layer.

According to an embodiment of the present invention, the manufacture method comprises following steps.

Step S1, forming a pattern including a gate electrode on a substrate.

Step S2, forming a gate insulating layer pattern on the substrate having been subjected to step S1.

Step S3, forming a pattern including an active layer on the substrate having been subjected to step S2.

Step S4, forming a pattern including a pixel electrode and forming a pattern including a source electrode and a drain electrode on the substrate having been subjected to step S3, wherein the pixel electrode is electrically connected with the drain electrode.

Step S5, forming a passivation layer pattern on the substrate having been subjected to step S4, wherein the passivation layer pattern covers the source electrode, the drain electrode and the pixel electrode; and forming a via hole in the passivation layer located on the drain electrode.

Step S6, forming a pattern including a common electrode and a test electrode on the substrate having been subjected to step S5, wherein the test electrode passes through the via hole from an upper surface of the drain electrode and projects out of an external surface of the passivation layer.

According to a further embodiment of the present invention, the step S1 comprises forming a metallic film on a substrate; and forming a pattern including a gate electrode and a gate line by a single patterning process, wherein the gate line is connected with the gate electrode.

According to a further embodiment of the present invention, the step S2 comprises forming a gate insulating layer film on the substrate having been subjected to the step S1; and forming a gate insulating layer pattern by a patterning process.

According to a further embodiment of the present invention, the step S3 comprises forming an active layer film on the substrate having been subjected to the step S2; and forming a pattern including an active layer by a patterning process, wherein the active layer is located in a position on the gate insulating layer corresponding to the gate electrode.

According to a further embodiment of the present invention, the step S4 comprises steps S41-S42 as below.

Step S41, forming a pixel electrode film on the substrate having been subjected to the step S3; and forming a pattern including a pixel electrode by a patterning process, wherein the pixel electrode is located in an region on the gate insulating layer, where no active layer is formed.

Step 42, forming a metallic film on the substrate having been subjected to the step S41; and forming a pattern including a source electrode, a drain electrode and a data line by a single patterning process, wherein the source electrode and the drain electrode are located on the active layer at two sides respectively, the source electrode is connected with the data line, and the drain electrode extends onto the pixel electrode and is partially overlapped with the pixel electrode.

Alternatively, according to a further embodiment of the present invention, the step S4 comprises steps S41'-S42' as below.

Step S41', forming a metallic film on the substrate having been subjected to step S3; and forming a pattern including a source electrode, a drain electrode and a data line by a single patterning process, wherein the source electrode and the drain electrode are located on the active layer at two sides respectively, the source electrode is connected with the data line, and the drain electrode extends onto the gate insulating layer.

Step S42', forming a pixel electrode film on the substrate having been subjected to step S41'; and forming a pattern including a pixel electrode by a patterning process, wherein the pixel electrode is located in a region where no active layer is formed on the gate insulating layer, and the pixel electrode is partially overlapped with the drain electrode which extends onto the gate insulating layer.

According to an embodiment of the present invention, the step S5 comprises forming a passivation layer film on the substrate having been subjected to step S4; forming a passivation layer pattern by a patterning process, wherein the passivation layer pattern covers the source electrode, the drain electrode and the pixel electrode; and forming a via hole in the passivation layer located on the drain electrode.

According to an embodiment, the step S6 comprises forming a common electrode film on the substrate having been subjected to step S5; forming a pattern including a common electrode and a test electrode on the passivation layer by a single patterning process, wherein the test electrode passes through the via hole from the upper surface of the drain electrode and projects out of the external surface of the passivation layer, and the test electrode is insulated from the common electrode.

BRIEF DESCRIPTION OF THE DRAWINGS

Hereinafter specific examples of the array substrate, the manufacture method thereof and the LCD device as provided by embodiments of the present invention are described in details in conjunction with accompanying drawings, in which.

FIGS. 2A-2F and 3A-3F are plan schematic views illustrating the flow chart of manufacturing the array substrate shown in FIG. 1 and cross-sectional views taken along A-A' line of FIG. 1, respectively; wherein, FIG. 2A is a plan view illustrating forming a gate electrode and a gate line;

FIG. 3A is a cross-sectional view corresponding to FIG. 2A;

FIG. 2B is a plan view illustrating forming a gate insulating layer and an active layer;

FIG. 3B is a cross-sectional view corresponding to FIG. 2B;

FIG. 2C is a plan schematic view illustrating forming a pixel electrode;

FIG. 3C is a cross-sectional view corresponding to FIG. 2C;

FIG. 2D is a plan schematic view illustrating forming a source electrode and a drain electrode;

FIG. 3D is a cross-sectional view corresponding to FIG. 2D;

FIG. 2E is a plan schematic view illustrating forming a passivation layer and a via hole therein;

FIG. 3E is a cross-sectional view corresponding to FIG. 2E;

FIG. 2F is a plan schematic view illustrating forming a common electrode and a test electrode;

FIG. 3F is a cross-sectional view corresponding to FIG. 2F.

Figure 1:
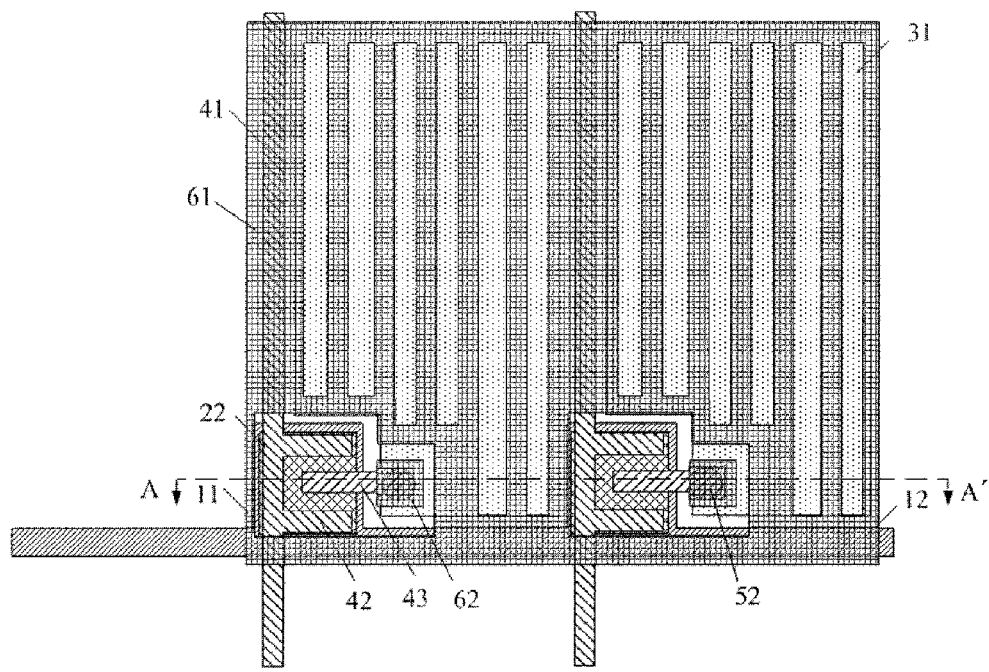
FIG. 1 is a plan schematic view of an array substrate according to a first embodiment of the present invention.

In the drawings, 10—substrate; 11—gate electrode; 12—gate line; 21—gate insulating layer; 22—active layer; 31—pixel electrode; 41—data line; 42—source electrode; 43—drain electrode; 51—passivation layer; 52—via hole; 61—common electrode; 62—test electrode.

DETAILED DESCRIPTION

To allow an ordinary skill in the art to better understand the technical solutions of the present invention, the array substrate, the manufacture method thereof and the LCD device of the present invention will be described clearly and completely as below in conjunction with the accompanying drawings and embodiments of the present invention. It is apparent that the described embodiments are only a part of but not all of exemplary embodiments of the present invention. Based on the described embodiments of the present invention, all of other embodiments, which can be obtained by those of ordinary skill in the art without creative labor, shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "connect/connecting/connected," or the like, are not intended to define a physical connection or mechanical connection, but may include an electrical connection/coupling, directly or indirectly. The terms, such as "On," "under," or the like, are only used to indicate relative position relationship, and when the position of the object which is described is changed, the relative position relationship may be changed accordingly.

The array substrate as provided by embodiments of the present invention comprises a substrate and a plurality of sub-pixel units disposed on the substrate. The sub-pixel unit comprises a thin film transistor, a pixel electrode, a common electrode and a passivation layer. The thin film transistor comprises an active layer, a gate electrode, a source electrode and a drain electrode. The drain electrode is electrically connected with the pixel electrode. The passivation layer covers the source electrode, the drain electrode and the pixel electrode. The sub-pixel unit further comprises a test electrode which is electrically connected with the pixel electrode and is exposed at an external surface of the sub-pixel unit. The substrate can be a glass substrate, a quartz substrate, a plastic substrate or the like.

The LCD device as provided by embodiments of the present invention comprises the described array substrate.

The method of manufacturing an array substrate as provided by embodiments of the present invention, comprises: a step of forming a thin film transistor, a pixel electrode, a common electrode and a passivation layer on a substrate, wherein the thin film transistor comprises an active layer, a gate electrode, a source electrode and a drain electrode. The passivation layer is formed on the source electrode, the drain electrode and the pixel electrode. The method further comprises a step of forming a via hole in the passivation layer located on the drain electrode; and a step of forming a test electrode which passes through the via hole from an upper surface of the drain electrode and projects out of an external surface of the passivation layer.

The array substrate and the manufacture method thereof directly lead a signal of the pixel electrode or the drain electrode located in an internal layer to an uppermost layer of the sub-pixel unit by opening a via hole and arranging a test electrode in the passivation layer located on the drain electrode of a thin film transistor (TFT), so that an electrical characteristic of the TFT can be tested conveniently. The LCD device utilizing such an array substrate can obtain the same technical effect.

First Embodiment

The present embodiment provides an array substrate, comprising a substrate and a plurality of sub-pixel units disposed on the substrate. The sub-pixel unit comprises a thin film transistor, a pixel electrode, a common electrode and a passivation layer. The thin film transistor comprises an active layer, a gate electrode, a source electrode and a drain electrode. The drain electrode is electrically connected with the pixel electrode. The passivation layer covers the source electrode, the drain electrode and the pixel electrode, wherein the sub-pixel unit further comprises a test electrode which is electrically connected with the pixel electrode and is exposed at an external surface of the sub-pixel unit.

As shown in FIG. 1, a gate electrode 11, an active layer 22, a pixel electrode 31, a source electrode 42, a drain electrode 43, a passivation layer 51 and a common electrode 61 are successively stacked in a sub-pixel unit. A region of the passivation layer 51 corresponding to the drain electrode 43 is provided with a via hole 52, and a test electrode 62 passes through the via hole from an upper surface of the drain electrode and projects out of an external surface of the passivation layer. The test electrode 62 is formed on the external surface of the passivation layer 51 and is electrically connected with the drain electrode 43.

In the present embodiment, the test electrode 62 projects out of the external surface of the passivation layer, and the test electrode 62 has a cross sectional area larger than that of the via hole 52. In this way, it allow the test electrode 62 to completely fill the via hole 52 and also facilitates a complete electrical connection between the test electrode 62 and the pixel electrode or drain electrode located beneath the passivation layer 51 so as to reduce the contact resistance. Furthermore, it enables the test electrode 62 to be conveniently connected in a press way onto the test probe during subsequent test.

In the array substrate according to the present embodiment, the common electrode 61 is disposed on the passivation layer 51 in a comb-like shape, and insulated from the test electrode 62. The expression "the common electrodes 61 (is) in a comb-like shape" intends to mean that the common electrode 61 includes a plurality of connected slit electrodes which are distributed on the passivation layer 51, as shown in FIG. 1. The test electrode 62 is an island-like electrode which is located on the drain electrode 43 and passes through the via hole 52 in the passivation layer 52 and exposed to the external layer of the passivation layer 51.

The test electrode 62 and the common electrode 61 are made from the same material, i.e., the pixel electrode 31, the test electrode 62 and the common electrode 61 are all made from at least one material of Indium Gallium Zinc Oxide (IGZO), Indium Zinc Oxide (IZO), Indium Tin Oxide (ITO) and Indium Gallium Tin Oxide (IGTO).

The array substrate according to the present embodiment further comprises a gate insulating layer 21 located on the gate electrode 11. The active layer 22 is located in a region on the gate insulating layer 21, which region corresponds to a region where the gate electrode 11 is. The source electrode 42 and drain electrode 43 are located on the active layer 22 at two sides respectively. The drain electrode 43 extends onto the gate insulating layer 21 and is partially overlapped with the pixel electrode 31, or, the drain electrode 43 extends onto the pixel electrode 31 and is partially overlapped with the pixel electrode 31, so that the layers where these two electrodes are located are abutted and directly contacted with each other. The test electrode 62 is electrically connected with the drain electrode 43, and the drain electrode 43 is in turn electrically connected with the pixel electrode 31, so the test electrode 62 is also electrically connected with the pixel electrode 31.

The passivation layer 51 can be made from at least one material of silicon oxide, silicon nitride, hafnium oxide and Al oxide. The gate electrode 11, the source electrode 42 and the drain electrode 43 can be made from at least one material of Mo, Mo—Nb alloy, Al, Al—Nd alloy, Ti and Cu. The gate insulating layer 21 can be made from at least one material of silicon oxide, silicon nitride, hafnium oxide, silicon nitrogen oxide and Al oxide. In the present embodiment, the active layer 22 can be made from an amorphous silicon material or a similar semiconductor material.

During the operation of the LCD panel, an electrical field generated between the pixel electrode 31 and the common electrode 61 deflects the LC molecules so as to control the transmittance for image display.

A manufacture method of the described array substrate comprises a step of forming a thin film transistor, a pixel electrode, a common electrode and a passivation layer on a substrate, wherein the thin film transistor comprises an active layer, a gate electrode, a source electrode and a drain electrode. The passivation layer is formed on the source electrode, the drain electrode and the pixel electrode. The method further comprises a step of forming a via hole in the passivation layer located on the drain electrode; and a step of forming a test electrode which passes through the via hole from an upper surface of the drain electrode and projects out of an external surface of the passivation layer.

To explain the manufacture method for details later, it should be understood that the patterning process under the present invention can include only a photolithography, or include a photolithography and an etching process as well as other processes for forming pre-determined patterns, such as printing and ink-jetting process. The photolithography includes procedures, such as filming, exposing and developing, and accordingly it requires utilization of photoresist, mask plate, exposure machine and the like. The proper patterning process can be selected depending on the structure as formed in the present invention. The photoresist as utilized can be a positive or a negative photoresist.

An example of the manufacture method of an array substrate comprises steps as below.

Step S1, a pattern including a gate electrode is formed on a substrate.

Figure 2A:
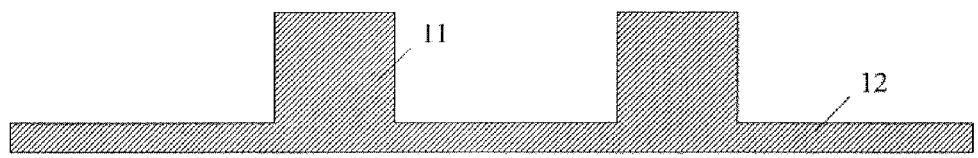
Figure 3A:
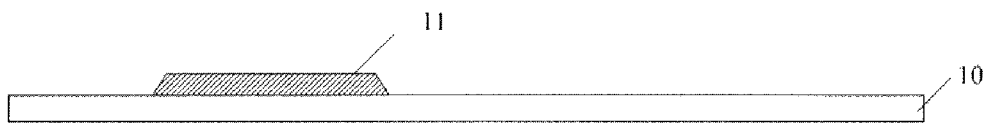

In this step, as shown in FIGS. 2A and 3A, firstly, a metallic film (i.e., a metallic film of gate electrode) is formed, and a pattern including a gate electrode 11 and a gate line 12 is formed by a single patterning process, wherein the gate electrode 11 is connected with the gate line 12.

The metallic film is formed by using a method, such as depositing, sputtering and thermal evaporation. The metallic film can have a thickness ranging from approximately 1000 Å to 7000 Å. For the patterning process as discussed, firstly a layer of photoresist is applied on the metallic film, then, the photoresist is exposed, developed, etched by using a mask and stripped off, so that a pattern including a gate electrode 11 and a gate line 12 is formed.

Herein, a cross-sectional view of one TFT in the array substrate is shown in FIG. 3A while a plan schematic view of two TFTs in the array substrate is shown in FIG. 2A, in order to illustrate the sectional structure of the array substrate during the manufacture according to the present embodiment in a more outstanding manner, other cross-sectional views and plan views as mentioned later are also provided similarly.

Step S2, a gate insulating layer pattern is formed on the substrate having been subjected to step S1 by a patterning process.

Figure 3B:
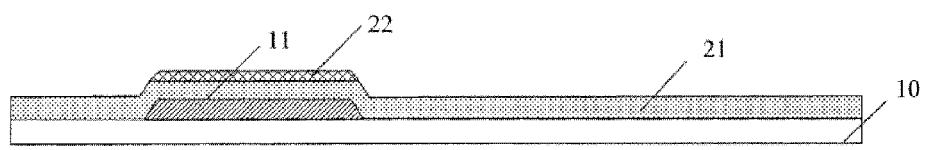

In this step, as shown in FIG. 3B, a gate insulating layer film is formed on the substrate having been subjected to step S1, and a pattern of the gate insulating film (UI) is formed by a patterning process.

The gate insulating layer film can be formed by using chemical vapor deposition (CVD). The gate insulating layer film as formed has a thickness ranging from approximately 1000 Å to 6000 Å.

Herein, the gate insulating layer 21 is formed on the gate electrode 11 and the gate line 12, and extends to a peripheral lead area of the array substrate. In the peripheral lead area of the array substrate, an electrode for leading a gate line driving signal is provided. The gate insulating layer 21 is formed with a via hole in a position corresponding to the electrode for leading a gate line driving signal, and the gate line 12 and the electrode for leading a gate line driving signal are bonded together through the via hole.

Step S3, a pattern including an active layer is formed on the substrate having been subjected to step S2.

Figure 2B:
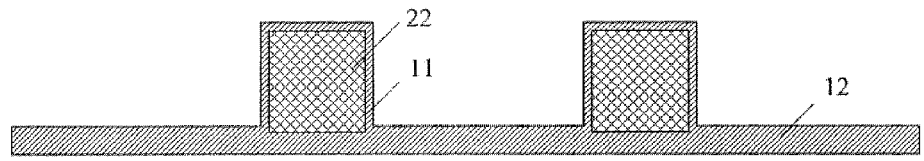

In this step, as shown in FIGS. 2B and 3B, an active layer film is formed on the substrate 10 having been subjected to step S2, and a pattern including an active layer 22 is formed by a patterning process, wherein the active layer 22 is located in a region on the gate insulating layer, which region corresponds to the region where the gate electrode 11 is.

The active layer film can have a thickness ranging from approximately 1000 Å to 6000 Å. During the patterning process, firstly a layer of photoresist is applied on the active layer film, then, the photoresist is exposed, developed, etched by using a mask and stripped off, so that a pattern including an active layer 22 is formed on the gate electrode. In an embodiment, a dry etching can be conducted to the active layer film to form a pattern of the active layer 22, and the active layer 22 for one TFT forms a silicon island.

Herein, the gate insulating layer 21 typically is made from a transparent material (e.g., silicon oxide, silicon nitride, hafnium oxide, silicon nitrogen oxide or aluminium oxide). The gate insulating layer 21 is removed from the plan schematic view as shown in FIG. 2B for better illustration of relative positions of the gate electrode 11, the gate line 12 and the active layer 22, to avoid hindering an observation to the plan view.

Step S4, a pattern including a pixel electrode is formed and a pattern including a source electrode and a drain electrode is formed on the substrate having been subjected to step S3, wherein the pixel electrode is electrically connected with the drain electrode.

A specific example of step S4 can include steps S41-S42 as below.

Step S41, a pixel electrode film is formed on the substrate having been subjected to step S3; and a pattern including a pixel electrode 31 is formed by a patterning process, wherein the pixel electrode 31 is located in a region on the gate insulating layer, where no active layer is formed.

Figure 2C:
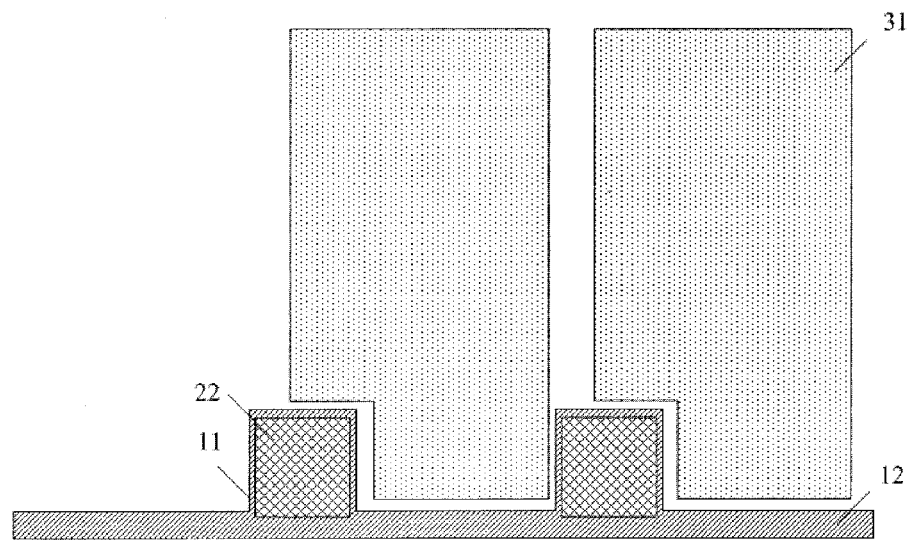
Figure 3C:
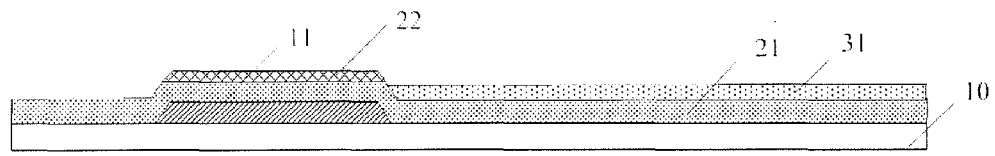

In this step S41, as shown in FIGS. 2C and 3C, a pixel electrode film is formed on the substrate 10 having been subjected to step S3, and a pattern including a pixel electrode 31 is formed by a patterning process, wherein the pixel electrode 31 is located in a region on the gate insulating layer 21, where no active layer 22 is formed.

The pixel electrode film can be formed by using a method, such as chemical vapor deposition, sputtering and thermal evaporation. The pixel electrode film has a thickness ranging from approximately 100 Å to 1000 Å. For the patterning process as discussed, firstly, a layer of photoresist is applied on the pixel electrode film, then the photoresist is exposed, developed, etched by using a mask and stripped off, so that a pattern of the pixel electrode 31 is formed. In the present embodiment, the pixel electrode 31 has a shape of rectangle, which is advantageous for increasing aperture ratio of pixels.

It should be appreciated that the pixel electrode 31 can have other shapes, such as a wedge-shape or a round shape, and the present invention is not limited thereto.

Step S42, a metallic film is formed on the substrate having been subjected to step S41, and a pattern including a source electrode, a drain electrode and a data line is formed by a single patterning process. The source electrode and the drain electrode are located on the active layer at two sides respectively. The source electrode is connected with the data line, and the drain electrode extends onto the pixel electrode and is partially overlapped with the pixel electrode.

Figure 2D:
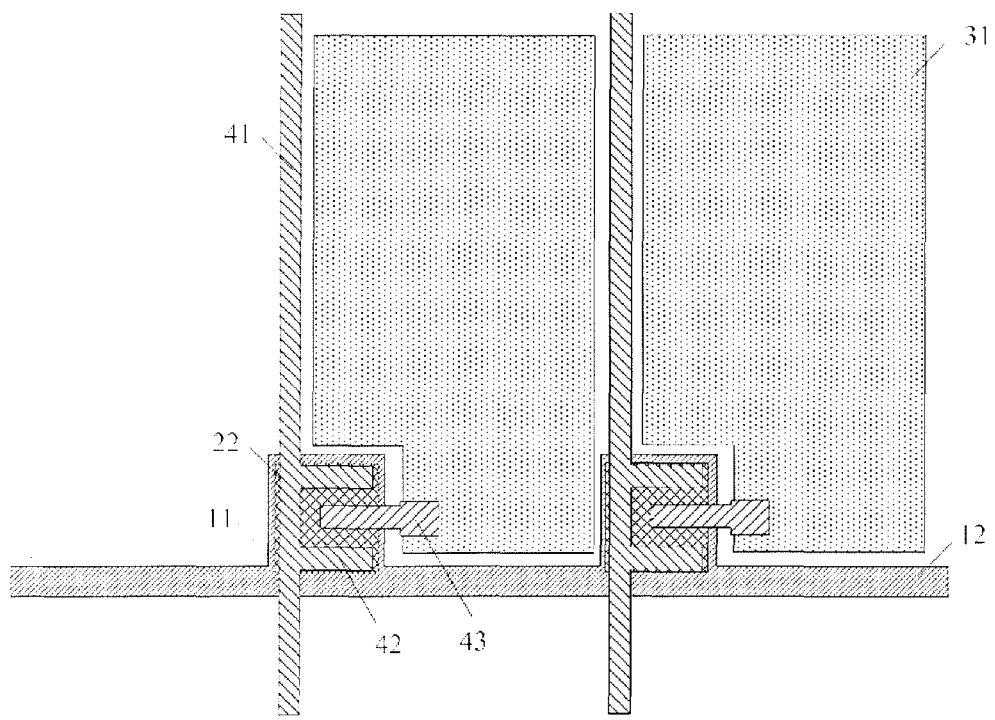
Figure 3D:
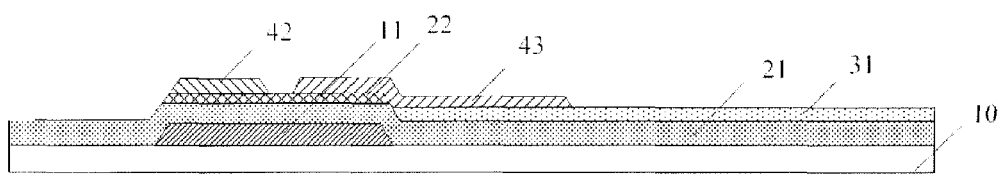

In this step S42, as shown in FIGS. 2D and 3D, a metallic film (i.e., a metallic film of source electrode and drain electrode) is formed on the substrate 10 having been subjected to step S41, and a pattern including a source electrode 42, a drain electrode 43 and a data line 41 is formed by a single patterning process. The source electrode 42 and the drain electrode 43 are located on the active layer 22 at two sides respectively. The source electrode 42 is connected with the data line 41. The drain electrode 43 extends to be partially overlapped with the pixel electrode 31.

The metallic film can be formed by using a method, such as depositing, sputtering and thermal evaporation. During the patterning process, firstly, a layer of photoresist is applied on the metallic film, then, the photoresist is exposed, developed, etched by using a mask and stripped off, so that a pattern including a source electrode 42, a drain electrode 43 and a data line 41 is formed.

Herein, it should be appreciated that the sequence of forming the source electrode and the drain electrode and forming the pixel electrode is not particularly defined but it can be flexibly arranged depending on technological conditions or operational convenience during a TFT or an array substrate is made. In other words, another example of step S4 can further comprise steps S41'-S42' as below.

Step S41', a metallic film is formed on the substrate having been subjected to step S3; and a pattern including a source electrode, a drain electrode and a data line is formed by a single patterning process. The source electrode and the drain electrode are located on the active layer at two sides respectively. The source electrode is connected with the data line, and the drain electrode extends onto the gate insulating layer.

Step S42', a pixel electrode film is formed on the substrate having been subjected to step S41'; and a pattern including a pixel electrode is formed by a patterning process. The pixel electrode is located in a region on the gate insulating layer, where no active layer is formed. The pixel electrode is partially overlapped with the drain electrode which extends onto the gate insulating layer.

Step S5, a passivation layer pattern is formed on the substrate having been subjected to step S4. The passivation layer pattern covers the source electrode, the drain electrode and the pixel electrode, a via hole is opened in the passivation layer located on the drain electrode.

Figure 2E:
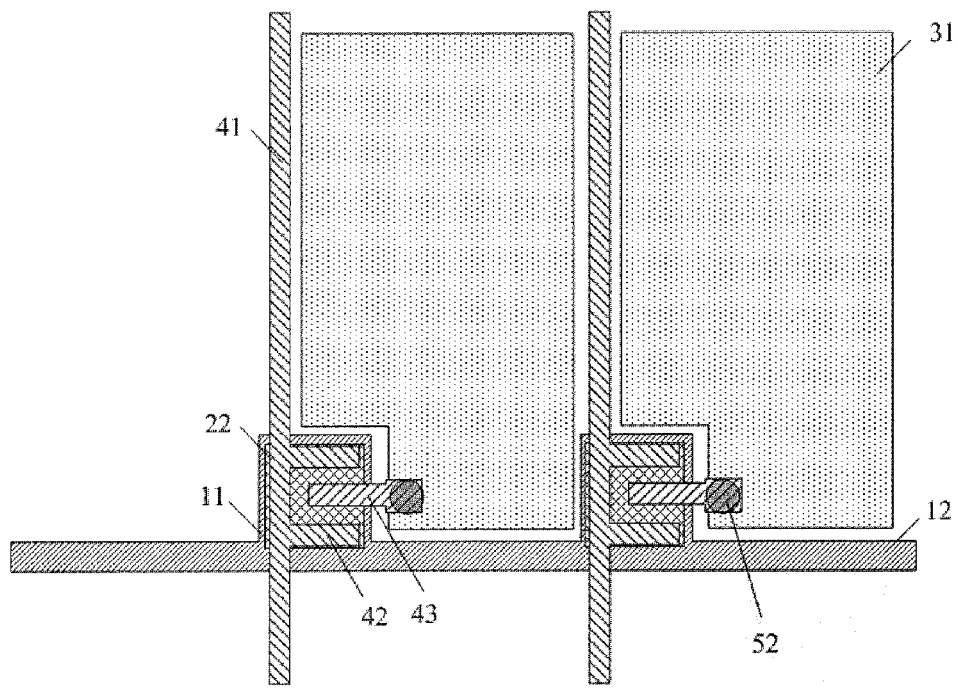
Figure 3E:
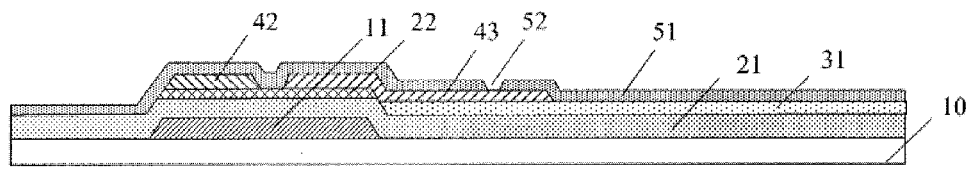

In this step S5, as shown in FIGS. 2E and 3E, a passivation layer film is formed on the substrate 10 having been subjected to step S4, and a passivation layer 51 (PVX) pattern is formed by a patterning process. The passivation layer 51 pattern covers the source electrode 42, the drain electrode 43 and the pixel electrode 31. A via hole 52 is opened in the passivation layer 51 located on the drain electrode 43. The drain electrode 43 is electrically connected with the pixel electrode 31 through the via hole 52.

The passivation layer film can be formed by using a method, such as depositing, sputtering and thermal evaporation. The passivation layer film has a thickness ranging from approximately 1000 Å to 6000 Å. During the patterning process, firstly, a layer of photoresist is applied on the passivation layer film, then the photoresist is exposed, developed, etched by using a mask and stripped off, so that a pattern including a passivation layer 51 and a via hole 52 is formed.

Now the passivation layer 51 is formed on the data line 41, the source electrode 42 and the drain electrode 42, and extends to a peripheral lead area of the array substrate. In the peripheral lead area of the array substrate, an electrode for leading a data line driving signal is provided. The passivation layer 51 is provided with a via hole in a position corresponding to the electrode for leading a data line driving signal, and the data line 41 and the electrode for leading a data line driving signal are bonded together through the via hole.

In this step, like the gate insulating layer 21, the passivation layer 51 is typically made from a transparent material (e.g., silicon oxide, silicon nitride, hafnium oxide or aluminium oxide). The passivation layer 51 is removed from the plan schematic view as shown in FIG. 2E for better illustration of relative positions of other structures, so as to avoid hindering an observation of the plan view.

Step S6, a pattern including a common electrode and a test electrode is formed on the substrate having been subjected to step S5. The test electrode passes through the via hole from an upper surface of the drain electrode and projects out of an external surface of the passivation layer. The test electrode is insulated from the common electrode.

Figure 2F:
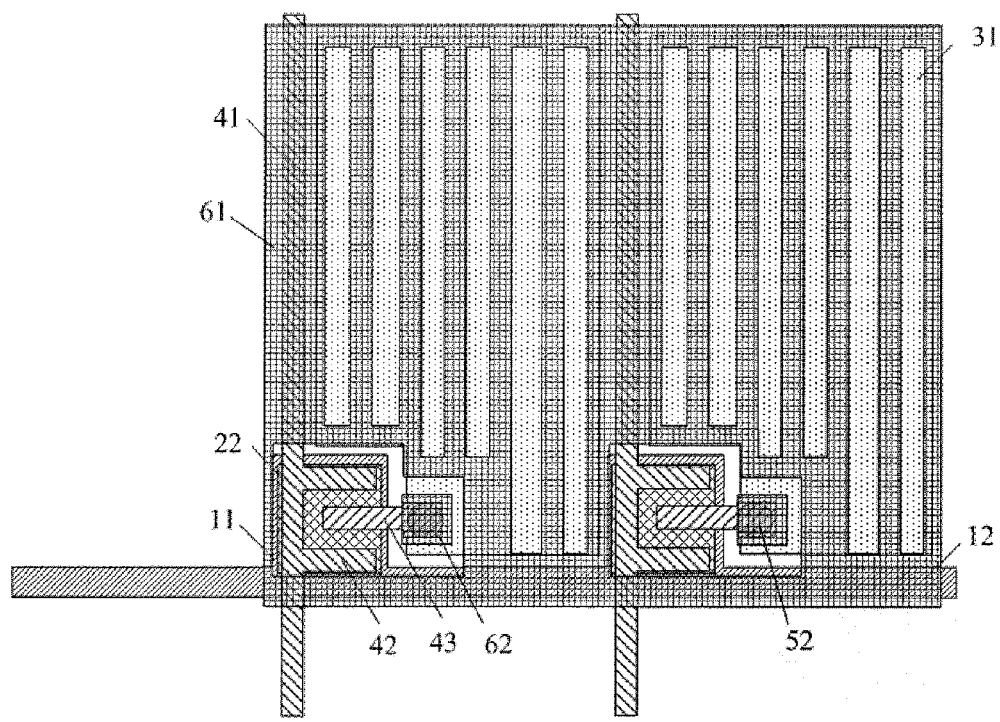
Figure 3F:
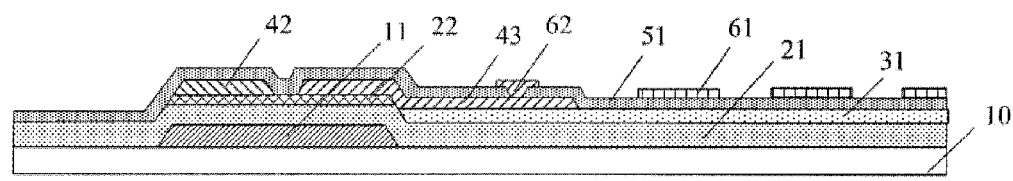

In this step S6, as shown in FIGS. 2F and 3F, a common electrode film is formed on the substrate 10 having been subjected to step S5, and a pattern including a common electrode 61 and a test electrode 62 is formed on the passivation layer 51 by a single patterning process. The test electrode 62 passes through the via hole 52 from an upper surface of the drain electrode 43 and projects out of an external surface of the passivation layer 51. The test electrode 62 is electrically connected with the drain electrode 43 located beneath the passivation layer 51 through the via hole 52, i.e., leading a signal of the pixel electrode 31 to be above the passivation layer 51.

The common electrode film can be formed by using a method, such as depositing, sputtering and thermal evaporation. During the patterning process, firstly, a layer of photoresist is applied on the common electrode film, then the photoresist is exposed, developed, etched by using a mask and stripped off, so that a pattern including a common electrode 61 and a test electrode 62 is formed. The common electrode 61 includes slit electrodes distributed like a comb, and the test electrode 62 is an island-like electrode located on the drain electrode.

The number of times of patterning processes can be reduced by using a half-tone mask plate or a grey-tone mask plate during various layers are formed in the manufacture method. The present invention is not limited thereto.

In the array substrate according the present embodiment, it is possible for the test probe to directly contact with the test electrode in the corresponding sub-pixel unit when an electrical characteristic test is required to be conducted on a TFT of a certain sub-pixel unit. Therefore the test is very convenient without any damage during the process, and hence it will not affect the sub-pixel unit or the array substrate.

In the case where a TFT in a sub-pixel unit is found short during the test, i.e., a channel between the source electrode and the drain electrode has not been sufficiently etched which leads to a bridging phenomenon and a short, a display region corresponding to this sub-pixel unit will become a bright spot. Since the pixel electrode in the present embodiment is provided with a test electrode formed in the same layer with the common electrode, as a remedial measure, now it only needs to cut off the source electrode and the drain electrode by using a laser, and connect the test electrode that is electrically connected with the drain electrode to the common electrode located aside, then a voltage of the common electrode is applied on the pixel electrode in a corresponding sub-pixel unit, that is, the pixel electrode and the common electrode have the same voltage (with a voltage difference of 0). In this way, the bright spot is changed to a dark spot, and the quality of the display panel is improved.

In the present embodiment, each of the sub-pixel units in the array substrate comprises a test electrode; alternatively, one sub-pixel unit from every N adjacent sub-pixel units comprises a test electrode, wherein N is a positive integer equal to or larger than 2. That is, based on the remedial measure by using a test electrode for solving bright spot due to short trouble of a TFT, it is possible to design each of the sub-pixels in the array substrate to have a structure with a test electrode; alternatively, it is also possible to design one sub-pixel unit from a group of sub-pixel units to have a structure with a test electrode as discussed above based on the applied environment or conditions of a liquid crystal display device using the array substrate, for example, for N=3 or 9, such group includes 3 or 9 sub-pixel units, so as to achieve better display quality.

An embodiment of the present invention provides a LCD device comprising the discussed array substrate. In each of the pixel units of the LCD device, a plate-like pixel electrode connected with a drain electrode of a TFT is located in a lower layer, while a slit-like common electrode distributed like a comb is located in an upper layer. By forming a multi-dimensional electric field consisted of an electric field generated between an edge of slit electrode and the plate electrode layer and an electric field generated between slit electrodes, all the LC molecules located in the LC cell are deflected, so as to achieve image display.

It should be explained that, although the present embodiment is described with a plate-like pixel electrode, those skilled in the art would appreciate that a slit-like pixel electrode is also possible, which merely needs to exchange the arrangement of the pixel electrode and the common electrode, so as to create a multi-dimensional electric field.

In the array substrate according to the present embodiment, for the passivation layer of the sub-pixel unit, a via hole is formed at a region corresponding to the drain electrode; and a test electrode connected with the drain electrode is formed at the same time of forming the common electrode. Since the pixel electrode is electrically connected with the drain electrode, the pixel electrode is also electrically connected with the test electrode. In this way, which is equivalent that a signal of the pixel electrode or drain electrode located in an internal layer is directly leaded to an uppermost layer of the sub-pixel unit so that an electrical characteristic test can be conveniently conducted on a TFT, which solves the problem that the electrical characteristic of a TFT under conventional design is difficult to measure. Also, since the pixel electrode is provided with a test electrode located in the same layer with the common electrode, it is very convenient to electrically connect the test electrode with the common electrode located aside when a certain TFT involves bright spot due to short failure. In this way, the pixel electrode of the TFT with a short failure will have an applied voltage same as the common voltage, so that the bright spot is changed into a dark spot, and the quality level of the LCD panel is increased.

The Second Embodiment

The present embodiment differs from the first embodiment in that the active layer in the sub-pixel unit of the array substrate is made from a MOS material.

In the present embodiment, the active layer is made from Indium Gallium Zinc Oxide (IGZO). Indium Zinc Oxide (IZO) and Indium Gallium Tin Oxide (IGTO). Since the active layer is made from a MOS, the electron mobility between the source electrode and the drain electrode is increased, so that the electron mobility between the source electrode and the drain electrode can be improved in a better way.

The material of the active layer in the array substrate according to the present invention is not particularly limited thereto. In addition to the amorphous silicon material used in the first embodiment and the MOS material used in the second embodiment, other materials, such as polycrystalline silicon, are also applicable for use in the thin film transistor and corresponding array substrate. Specific examples are omitted herein.

For other structures of the array substrate and corresponding manufacture method according to the present embodiment, reference can be made to the first embodiment.

In the array substrate according to embodiments of the present invention, the electrical characteristic of a TFT can be conveniently measured by opening a via hole and arranging a test electrode in the passivation layer located on the drain electrode of the TFT, in which the test electrode directly leads a signal of the pixel electrode or the drain electrode located in an internal layer to an external surface of the sub-pixel unit. In this way, it solves the problem that the electrical characteristic of a TFT under conventional design is difficult to measure. Also, it is very convenient to electrically connect the test electrode with the common electrode located aside when a certain TFT involves bright spot due to short failure. In this way, the pixel electrode of the TFT with short failure will have an applied voltage same as the common voltage, so that the bright spot can be changed into a dark spot, and the quality level of the LCD panel can be increased.

Embodiments of the present invention further provide a LCD device comprising the discussed array substrate. By using the discussed array substrate which is convenient for a characteristic test of a TFT, the test procedure of a LCD device is simplified. Also, such array substrate can easily address the failure of bright spot due to short trouble of a TFT, the display quality of the LCD display can be improved.

It is understood that the examples described above are merely illustrative embodiments for explaining the principle of the present invention, and the present invention is not intended to be limited thereto.

What is claimed is:

1. An array substrate, comprising
a substrate; and
a plurality of sub-pixel units provided on the substrate, wherein each sub-pixel unit comprises a thin film transistor, a pixel electrode, a common electrode and a passivation layer; the thin film transistor comprises an active layer, a gate electrode, a source electrode and a drain electrode; the drain electrode is electrically connected with the pixel electrode; the passivation layer covers the source electrode, the drain electrode and the pixel electrode; and wherein the sub-pixel unit further comprises a test electrode which is electrically connected with the pixel electrode and is exposed at an external surface of the sub-pixel unit and configured to test electrical characteristics of a TFT.

2. The array substrate according to claim 1, wherein, in the sub-pixel unit, a region of the passivation layer that covers the drain electrode is provided with a via hole; the test electrode passes through the via hole from an upper surface of the drain electrode and projects out of an external surface of the passivation layer; and the test electrode is electrically connected with the drain electrode.

3. The array substrate according to claim 2, wherein the test electrode projects out of an external surface of the passivation layer, and the test electrode has a cross sectional area larger than that of the via hole.

4. The array substrate according to claim 3, wherein the common electrode is provided on the passivation layer in a comb-like shape, and insulated from the test electrode.

5. The array substrate according to claim 4, further comprising a gate insulating layer located on the gate electrode; wherein the active layer is located in a position on the gate insulating layer corresponding to the gate electrode; the source electrode and the drain electrode are located on the active layer at two sides respectively; the drain electrode extends onto the gate insulating layer and is partially overlapped with the pixel electrode, or, the drain electrode extends onto the pixel electrode and is partially overlapped with the pixel electrode.

6. The array substrate according to claim 5, wherein the test electrode and the common electrode are made from the same material which includes at least one of Indium Gallium Zinc Oxide (IGZO), Indium Zinc Oxide (IZO), Indium Tin Oxide (ITO) and Indium Gallium Tin Oxide (IGTO).

7. The array substrate according to claim 6, wherein each sub-pixel unit in the array substrate comprises the test electrode; or, one sub-pixel unit from every N adjacent sub-pixel units comprises the test electrode, where N is a positive integer equal to or larger than 2.

8. The array substrate according to claim 1, wherein the test electrode projects out of an external surface of the passivation layer, and the test electrode has a cross sectional area larger than that of the via hole.

9. The array substrate according to claim 8, wherein the common electrode is provided on the passivation layer in a comb-like shape, and insulated from the test electrode.

10. The array substrate according to claim 1, wherein the common electrode is provided on the passivation layer in a comb-like shape, and insulated from the test electrode.

11. A liquid crystal display device comprising an array substrate, wherein the array substrate comprises:
a substrate; and
a plurality of sub-pixel units provided on the substrate, wherein each sub-pixel unit comprises a thin film transistor, a pixel electrode, a common electrode and a passivation layer; the thin film transistor comprise an active layer: a gate electrode, a source electrode and a drain electrode: the drain electrode is electrically connected with the pixel electrode: the passivation layer cove the source electrode the drain electrode and the pixel electrode; and wherein the sub-pixel unit further comprises a test electrode which is electrically connected with the pixel electrode and is exposed at an external surface of the sub-pixel unit and configured to test electrical characteristics of a TFT.

12. A manufacture method of an array substrate, comprising:
a step of forming a thin film transistor, a pixel electrode, a common electrode and a passivation layer on a substrate, wherein the thin film transistor comprises an active layer, a gate electrode, a source electrode and a drain electrode, the passivation layer is formed on the source electrode, the drain electrode and the pixel electrode;
a step of forming a via hole in the passivation layer located on the drain electrode; and
a step of forming a test electrode which passes through the via hole from an upper surface of the drain electrode and projects out of an external surface of the passivation layer to test electrical characteristics of a TFT.

13. The manufacture method according to claim 12, wherein,
step S1, forming a pattern including a gate electrode on a substrate;
step S2, forming a gate insulating layer pattern on the substrate having been subjected to the step S1;
step S3, forming a pattern including an active layer on the substrate having been subjected to the step S2;
step S4, forming a pattern including a pixel electrode and forming a pattern including a source electrode and a drain electrode on the substrate having been subjected to the step S3, wherein the pixel electrode is electrically connected with the drain electrode;
step S5, forming a passivation layer pattern on the substrate having been subjected to the step S4, wherein the passivation layer pattern covers the source electrode, the drain electrode and the pixel electrode; and forming the via hole in the passivation layer located on the drain electrode;
step S6, forming a pattern including a common electrode and a test electrode on the substrate having been subjected to the step S5, wherein the test electrode passes through the via hole from an upper surface of the drain electrode and projects out of the external surface of the passivation layer.

14. The manufacture method according to claim 13, wherein, the step S1 comprises forming a metallic film on the substrate; and forming a pattern including a gate electrode and a gate line by a single patterning process, wherein the gate electrode is connected with the gate line.

15. The manufacture method according to claim 13, wherein the step S2 comprises forming a gate insulating layer film on the substrate having been subjected to the step S1; and forming a gate insulating layer pattern by a patterning process.

16. The manufacture method according to claim 13, wherein the step S3 comprises forming an active layer film on the substrate having been subjected to the step S2; and forming a pattern including an active layer by a patterning process, wherein the active layer is located in a position on the gate insulating layer corresponding to the gate electrode.

17. The manufacture method according to claim 13, wherein the step S4 comprises:
step S41, forming a pixel electrode film on the substrate having been subjected to the step S3; and forming a pattern including a pixel electrode by a patterning process, wherein the pixel electrode is located in an region on the gate insulating layer, where no active layer is formed;

step 42, forming a metallic film on the substrate having been subjected to the step S41; and forming a pattern including a source electrode, a drain electrode and a data line by a single patterning process, wherein the source electrode and the drain electrode are located on the active layer at two sides respectively, the source electrode is connected with the data line, and the drain electrode extends onto the pixel electrode and is partially overlapped with the pixel electrode.

18. The manufacture method according to claim 13, wherein the step S4 comprises:
step S41', forming a metallic film on the substrate having been subjected to the step S3; and forming a pattern including a source electrode, a drain electrode and a data line by a single patterning process, wherein the source electrode and the drain electrode are located on the active layer at two sides respectively, the source electrode is connected with the data line, and the drain electrode extends onto the gate insulating layer;
step S42', forming a pixel electrode film on the substrate having been subjected to the step S41'; and forming a pattern including a pixel electrode by a patterning process, wherein the pixel electrode is located in a region on the gate insulating layer, where no active layer is formed; the pixel electrode is partially overlapped with the drain electrode which extends onto the gate insulating layer.

19. The manufacture method according to claim 13, wherein, the step S5 comprises forming a passivation layer film on the substrate having been subjected to the step S4; forming a passivation layer pattern by a patterning process, wherein the passivation layer pattern covers the source electrode, the drain electrode and the pixel electrode; and forming the via hole in the passivation layer located on the drain electrode.

20. The manufacture method according to claim 13, wherein the step S6 comprises forming a common electrode film on the substrate having been subjected to the step S5; and forming a pattern including a common electrode and a test electrode on the passivation layer by a single patterning process, wherein the test electrode passes through the via hole from the upper surface of the drain electrode and projects out of the external surface of the passivation layer, and the test electrode is insulated from the common electrode.

* * * * *